ис009680460В2

United States Patent
Jeong

(10) Patent No.: US 9,680,460 B2
(45) Date of Patent: Jun. 13, 2017

(54) SIGNAL TRANSMISSION METHOD OF SEMICONDUCTOR INTEGRATED CIRCUIT FOR TRANSMITTING SIGNAL TO A PLURALITY OF STACKED SEMICONDUCTOR CHIPS

(71) Applicant: SK hynix Inc., Gyeonggi-do (KR)

(72) Inventor: Chun-Seok Jeong, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 359 days.

(21) Appl. No.: 14/487,816

(22) Filed: Sep. 16, 2014

(65) Prior Publication Data

US 2015/0002202 A1 Jan. 1, 2015

Related U.S. Application Data

(62) Division of application No. 13/270,437, filed on Oct. 11, 2011, now Pat. No. 8,860,231.

(30) Foreign Application Priority Data

Jul. 21, 2011 (KR) ........................ 10-2011-0072456

(51) Int. Cl.
*H03K 5/14* (2014.01)
*H03K 5/135* (2006.01)
*H03K 19/003* (2006.01)
*G01R 31/28* (2006.01)
*H01L 25/10* (2006.01)

(52) U.S. Cl.
CPC .......... *H03K 5/14* (2013.01); *G01R 31/2853* (2013.01); *H01L 25/105* (2013.01); *H03K 5/135* (2013.01); *H03K 19/00323* (2013.01); *H01L 2225/1047* (2013.01); *H01L 2924/0002* (2013.01)

(58) Field of Classification Search
CPC ......................................................... G11C 5/00
USPC .......................................................... 365/148
See application file for complete search history.

(56) References Cited

U.S. PATENT DOCUMENTS

2009/0237970 A1* 9/2009 Chung ..................... G11C 5/02
365/51
2011/0093235 A1* 4/2011 Oh ..................... G01R 31/2884
702/120

FOREIGN PATENT DOCUMENTS

CN 1610109 4/2005
CN 102054824 5/2011

OTHER PUBLICATIONS

Office Action issued by the State Intellectual Property Office of the People's Republic of China on Nov. 18, 2015.

* cited by examiner

*Primary Examiner* — Thao H Bui
*Assistant Examiner* — Alfredo Bermudez Lozada
(74) *Attorney, Agent, or Firm* — IP & T Group LLP

(57) ABSTRACT

A semiconductor integrated circuit includes a plurality of semiconductor chips stacked in a multi-layer structure; a correction circuit in each semiconductor chip configured to reflect a delay time corresponding to the position of the chip in the stack into an input signal to output to each semiconductor chip; and a plurality of through-chip vias formed vertically through each of the semiconductor chips and configured to transmit the input signal to the semiconductor chip.

6 Claims, 8 Drawing Sheets

SIGNAL TRANSMISSION METHOD OF SEMICONDUCTOR INTEGRATED CIRCUIT FOR TRANSMITTING SIGNAL TO A PLURALITY OF STACKED SEMICONDUCTOR CHIPS

CROSS-REFERENCE TO RELATED APPLICATIONS

This application is a division of U.S. patent application Ser. No. 13/270,437 filed on Oct. 11, 2011, which claims priority of Korean Patent Application No. 10-2011-0072456, filed on Jul. 21, 2011. The disclosure of each of the foregoing application is incorporated herein by reference in its entirety.

BACKGROUND

1. Field

Exemplary embodiments of the present invention relate to semiconductor design technology, and more particularly, to a semiconductor integrated circuit having a multilayer structure and a signal transmission method thereof.

2. Description of the Related Art

In general, packaging technology for semiconductor integrated circuits has features for miniaturization and mounting reliability. A stack package may have the features of high performance and small circuit size.

In the semiconductor industry, a "stack" means vertically stacking at least two or more semiconductor chips or packages. When a stack package is used in a semiconductor memory device, a memory capacity of the semiconductor memory device may be two or more times larger than a memory capacity of a semiconductor memory device that does not implement a stack package. Furthermore, the stack package not only increases the memory capacity, but it also more efficiently uses the mounting area. Also, the stack package has higher packaging density.

The stack package may be fabricated by the following methods. First, individual semiconductor chips may be stacked, and then packaged. Second, packaged individual semiconductor chips may be stacked. The individual semiconductor chips of the stacked semiconductor package are electrically coupled through metallic wires or by through silicon vias (TSVs). The stack package using TSVs has a structure where the physical and electrical coupling between semiconductor chips are vertically achieved by TSVs formed in the respective semiconductor chips. For reference, various methods are used to form the TSVs such as a via first process, a via last process, a via last from backside and so on.

FIGS. 1A to 1G illustrate a method for forming a TSV. In the following descriptions, a via middle process will be illustrated as an example. The via middle process forms a TSV in a state where a part of a circuit is formed in an active layer.

Referring to FIG. 1A, an active layer 104 and a transistor 106 are formed on a wafer substrate 102. Referring to FIG. 1B, the active layer 104 and the wafer substrate 102 are etched to form a groove with a designated depth, and the groove is filled with a conductive material, such as a metal (for example, copper), to provide the base of a TSV 108.

Referring to FIG. 1C, an interlayer dielectric layer 110 is formed on the active layer 104, and metal lines 112 are formed in the interlayer dielectric layer 110. The metal lines 112 are electrically coupled to the TSV 108 and the transistor 106. A TSV pad 114 is formed on the metal line above the TSV 108, and the TSV pad 114 will be used to electrically couple the TSV 108.

Referring to FIG. 1D, when the TSV pad 114 is formed, a bump 116 is formed and electrically coupled to the TSV pad 114. The bump 116 is a component that electrically couples the TSV 108 to a TSV formed in another semiconductor chip that is stacked. A carrier 118 is subsequently formed over the interlayer dielectric layer 110. The carrier 118 is a component that fixes a wafer during a wafer thinning process (shown in FIG. 1E), which is performed to expose one end of the TSV 108.

Referring to FIG. 1E, the wafer thinning process is performed to expose one of the ends of the TSV 108. A bump 120 is formed at the exposed end of the TSV 108, which was exposed by the wafer thinning process. Then, referring to FIG. 1F, the carrier 118 is removed. Accordingly, a semiconductor chip 100A for stacking is fabricated, and the bumps 116 and 120 are provided on the top and bottom of the semiconductor chip 100A.

Referring to FIG. 1G, the semiconductor chips 100A and 100B are stacked and the electrically coupled to each other through the bumps that are connected to the TSVs.

Hereafter, a signal transmission path through the plurality of vertically stacked semiconductor chips (hereafter, referred to as "semiconductor integrated circuit") will be described.

FIG. 2 is a side view of a semiconductor integrated circuit illustrating how a signal applied to the semiconductor integrated circuit is transmitted to the respective semiconductor chips through TSVs. The respective semiconductor chips and the TSVs in the semiconductor integrated circuit of FIG. 2 may be illustrated similarly to FIGS. 1A to 1G. For illustration purposes, however, they are conceptually illustrated.

Referring to FIG. 2, a signal SIG is buffered into an internal signal SIG1 through a buffer BUF provided in a first semiconductor chip CHIP1, and transmitted to a TSV TSV1 while applied to the first semiconductor chip CHIP1. Furthermore, a signal SIG2 transmitted from the TSV TSV1 is transmitted to a TSV TSV2 while applied to a second semiconductor chip CHIP2. Furthermore, a signal SIG3 transmitted from the TSV TSV2 is transmitted to a TSV TSV3 while applied to a third semiconductor chip CHIP3. Furthermore, a signal SIG4 transmitted from the TSV TSV3 is applied to a fourth semiconductor chip CHIP4.

When the respective signals SIG, SIG1, SIG2, SIG3, and SIG4 are transmitted, a delay time caused by the buffer BUF provided in the first semiconductor chip CHIP1 may be represented by 'tDbuf', and a delay time caused by each of the TSVs TSV1, TSV2, and TSV3 may be represented by 'tDtsv'. Referring to FIG. 3, the signal SIG1 applied to the first semiconductor chip CHIP1 is delayed by 'tDbuf' from the signal SIG, the signal SIG2 applied to the second semiconductor chip CHIP2 is delayed by 'tDbuf+tDtsv' from the signal SIG, the signal SIG3 applied to the third semiconductor chip CHIP3 is delayed by 'tDbuf+(tDtsv*2)' from the signal SIG, and the signal SIG4 applied to the fourth semiconductor chip CHIP4 is delayed by 'tDbuf+(tDtsv*3)' from the signal SIG. In short, the signals SIG1, SIG2, SIG3, and SIG4 are each increasingly delayed depending on the number of TSVs that the signal is transmitted through. Because of the delays caused by the TSVs TSV1, TSV2, and TSV3, skews may occur.

The signal delay as a result of the TSVs TSV1, TSV2, and TSV3 is caused by a parasitic resistor and a parasitic capacitor (R*C) formed by the TSVs TSV1, TSV2, and TSV3 and the bumps of the TSVs. The skews caused by the signal delay limits high-speed operation.

SUMMARY

An embodiment of the present invention is directed to a semiconductor integrated circuit capable of minimizing skews occurring between a plurality of stacked semiconductor chips, and a signal transmission method thereof.

In accordance with an embodiment of the present invention, a semiconductor integrated circuit includes: a plurality of semiconductor chips stacked in a multilayer structure; a correction circuit in each semiconductor chip configured to reflect a delay time corresponding to the position of the chip in the stack into an input signal to output to each semiconductor chip; and a plurality of through-chip vias formed vertically through each of the semiconductor chips and configured to transmit the input signal to the semiconductor chip.

In accordance with another embodiment of the present invention, a semiconductor integrated circuit includes: a plurality of second semiconductor chips sequentially stacked over a first semiconductor chip the first semiconductor chip configured to transmit an external input signal to the second semiconductor chips; a correction circuit in the first semiconductor chip configured to reflect a delay time corresponding to the position of the chip in the stack into the external input signal to output to the first semiconductor chip; a correction circuit in each of the second semiconductor chips configured to reflect a delay time corresponding to the position of the chip in the stack into an input signal to output to the second semiconductor chips; and a plurality of first through-chip vias formed vertically through the plurality of second semiconductor chips, respectively, and configured to transmit the external input signal transmitted from the first semiconductor chip as the input signal to the second semiconductor chips, respectively.

In accordance with yet another embodiment of the present invention, a signal transmission method of a semiconductor integrated circuit, which transmits a signal applied from an external circuit to the plurality of stacked semiconductor chips, includes: calculating delay times that occur between the plurality of stacked semiconductor chips during a test mode; and reflecting the delay times into signals transmitted to the respective semiconductor chips and outputting the signals into the respective semiconductor chips, during a normal mode.

DETAILED DESCRIPTION

Figure 1A:
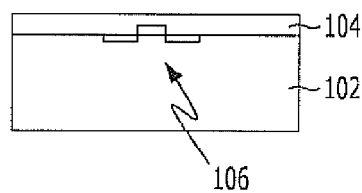
FIGS. 1A to 1G illustrate a method for forming a TSV.
Figure 1B:
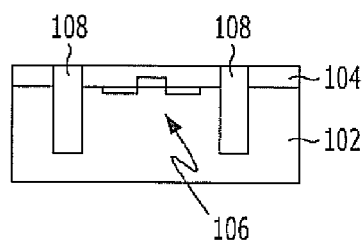
Figure 1C:
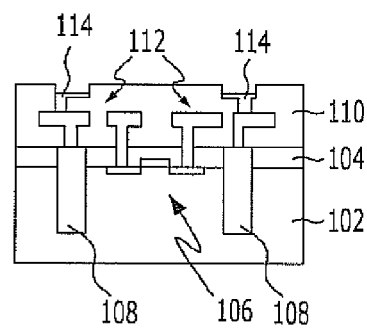
Figure 1D:
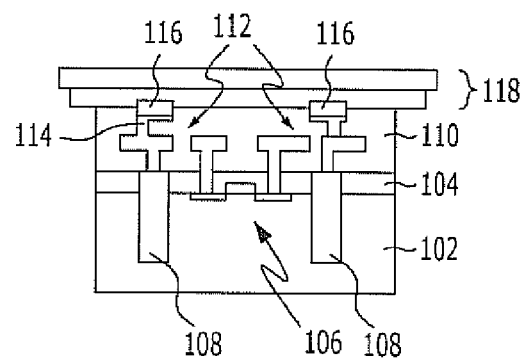
Figure 1E:
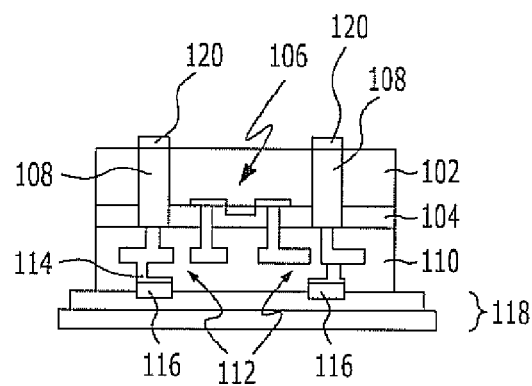
Figure 1F:
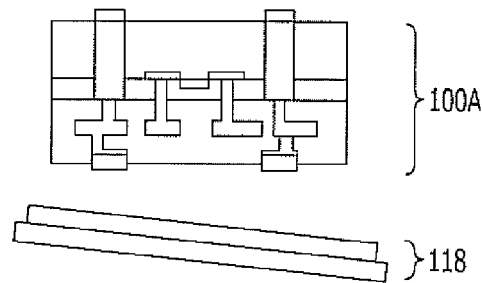
Figure 1G:
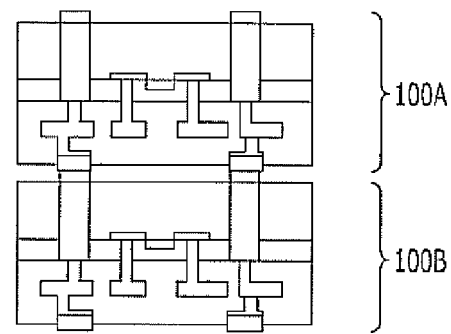
Figure 2:
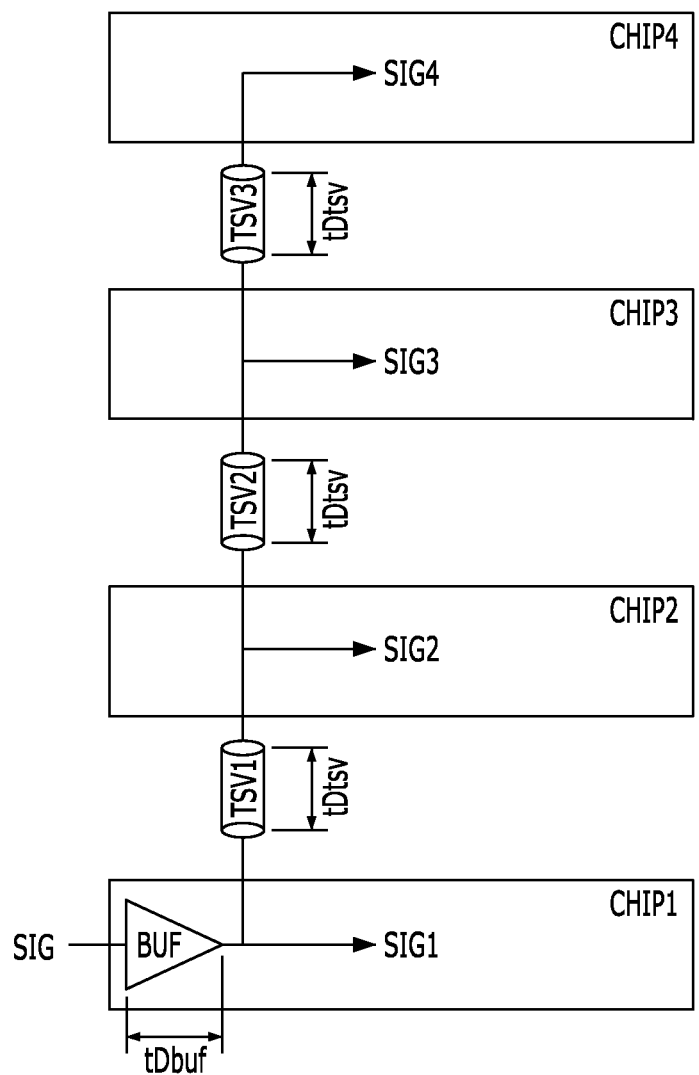
FIG. 2 is a configuration diagram of a conventional semiconductor integrated circuit illustrating a signal transmission method of the conventional semiconductor integrated circuit.
Figure 3:
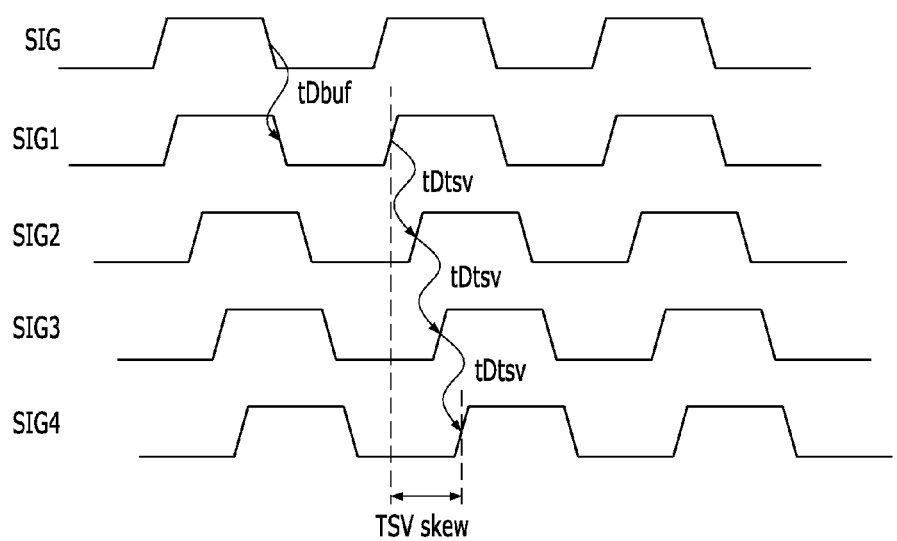
FIG. 3 is a timing diagram illustrating the signal transmission method of the semiconductor integrated circuit of FIG. 2.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

In the embodiments of the present invention, for example, four semiconductor chips are stacked. However, the embodiments of the present invention are not limited to a semiconductor device that has four semiconductor chips that are stacked, and more or less semiconductor chips may be stacked.

Figure 4:
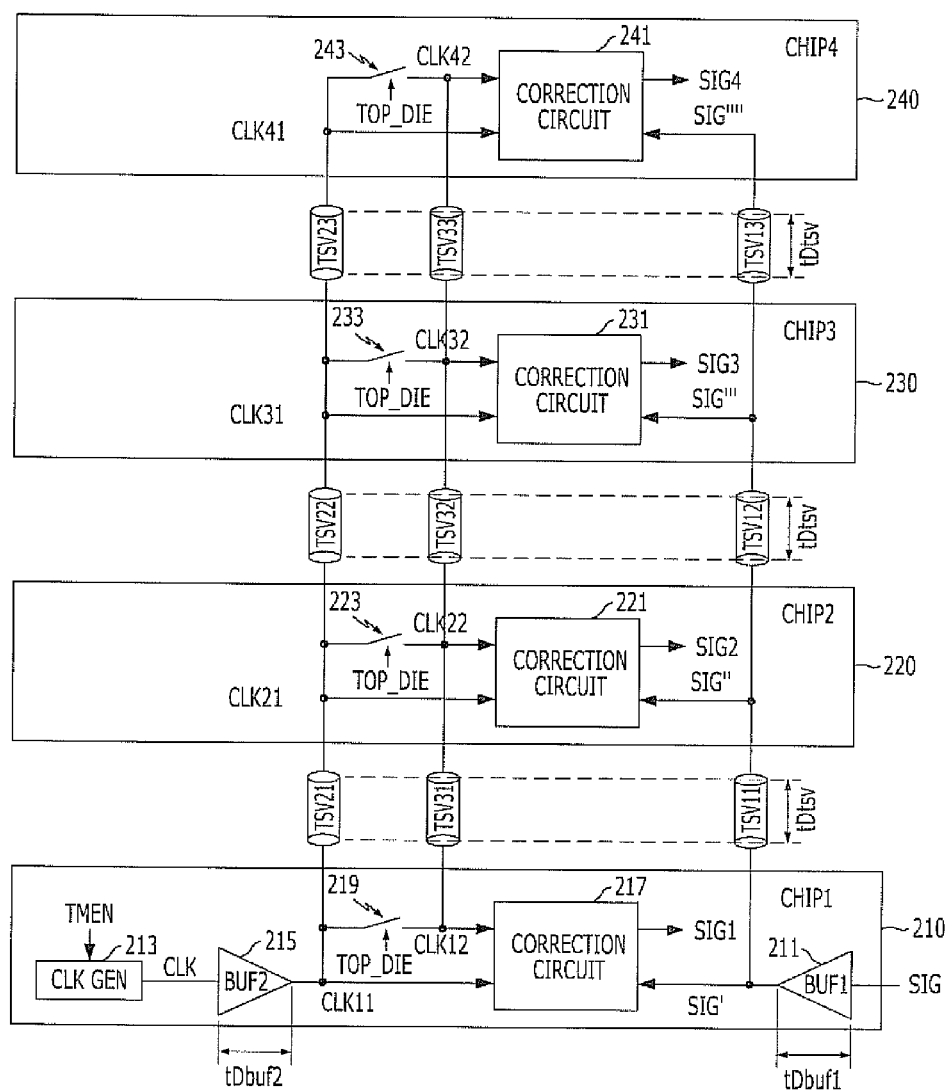
FIG. 4 conceptually illustrates a semiconductor integrated circuit in accordance with an embodiment of the present invention.

FIG. 4 conceptually illustrates a semiconductor integrated circuit in accordance with an embodiment of the present invention.

Referring to FIG. 4, the semiconductor integrated circuit 200 has a structure where a first semiconductor chip 210 has three second semiconductor chips 220, 230, and 240 that are sequentially stacked over the first semiconductor chip 210. The first semiconductor chip 210 receives an external signal SIG and is referred to as a master chip. The three second semiconductor chips 220, 230, and 240 are controlled by the master chip and are referred to as slave chips. The master chip and the slave chips may be fabricated through the same process or different processes.

The first semiconductor chip 210 includes a first buffer 211, a clock signal generator 213, a second buffer 215, and a correction circuit 217. The first buffer 211 is configured to buffer the external input signal SIG and output an internal signal SIG'. The clock signal generator 213 is configured to generate an internal clock signal CLK that has a designated period in response to a test enable signal TMEN. The second buffer 215 is configured to buffer the internal clock signal CLK. The correction circuit 217 is configured to reflect a delay time caused by signal transmission TSVs TSV11, TSV12, and TSV13 corresponding to the position of the chip in the stack into the internal signal SIG' and to output a first internal input signal SIG1.

The correction circuit 217 uses a first internal clock signal CLK11 outputted from the second buffer 215 and a second internal clock signal CLK12 obtained by passing the first internal clock signal CLK11 through all of the test TSVs TSV21, TSV22, TSV23, TSV33, TSV32, and TSV31 provided in the second semiconductor chips 220, 230, and 240. The correction circuit 217 calculates a delay time caused by signal transmission TSVs TSV11, TSV12, and TSV13 corresponding to the position of the chip in the stack of the first semiconductor chip 210.

A delay time tDbuf1 caused by the operation of the first buffer 211 may be equal to a delay time tDbuf2 caused by the operation of the second buffer 215. The clock signal generator 213 may generate an internal clock signal CLK having a sufficient period such that the correction circuit 217 may calculate a difference in phase caused by the delay time of the stacked structure.

In addition, the first semiconductor chip 210 further includes a switch 219 configured to couple two input terminals of the correction circuit 217 in response to a top die signal TOP_DIE. The top die signal TOP_DIE may be activated, for example, only in the uppermost second semiconductor chip 240. The two input terminals of the correction circuit 217 receive first and second internal clock signals CLK11 and CLK12.

The three second semiconductor chips 220, 230, and 240 include correction circuits 221, 231, and 241, the signal transmission TSVs TSV11, TSV12, and TSV13, first test TSVs TSV21, TSV22, and TSV23, and second test TSVs TSV31, TSV32, and TSV33, respectively.

The correction circuits 221, 231, and 241 are configured to reflect delay times caused by signal transmission TSVs TSV11, TSV12, and TSV13 corresponding to the position of each chip in the stack into input signals SIG", SIG''', and SIG'''' and to output a second to fourth internal input signals SIG1, SIG2, and SIG3, respectively. The signal transmission TSVs TSV11, TSV12, and TSV13 are formed vertically through the respective second semiconductor chips in a first position and configured to transmit the internal input signal SIG'. Because of the delay on the internal input signal SIG' caused by the TSVs, the second conductor chips 220, 230, and 240 receive the input signals SIG", SIG''', and SIG''''. The first test TSVs TSV21, TSV22, and TSV23 are formed vertically through the respective second semiconductor chips in a second position and configured to transmit the first internal clock signal CLK11 transmitted from the first semiconductor chip 210 to the second semiconductor chips 220, 230, and 240. The second test TSVs TSV31, TSV32, and TSV33 are formed vertically through the respective second semiconductors at a third position and configured to transmit a second internal signal CLK42 back to the first semiconductor chip 210 and the second semiconductor chips 220 and 230.

The respective correction circuits 221, 231, and 241 use the first internal clock signals CLK21, CLK31, and CLK41 transmitted through the first test TSVs TSV21, TSV22, and TSV23 and the second internal clock signals CLK22, CLK32, and CLK42 transmitted through the second test TSVs TSV31, TSV32, and TSV33, respectively, in order to calculate the delay times caused by signal transmission TSVs TSV11, TSV12, and TSV13 corresponding to the position of each chip in the stack. Additionally, the three second semiconductor chips 220, 230, and 240 further include switches 223, 233, and 243 configured to couple input terminals of the respective correction circuits 221, 231, and 241 in response to the top die signal TOP_DIE. For example, only the second semiconductor chip 240 stacked at the uppermost position may have the switch 243 activated. The input terminals receive the first internal clock signals CLK21, CLK31, and CLK41 and the second internal clock signals CLK 22, CLK 32, and CLK 42, respectively.

Figure 5:
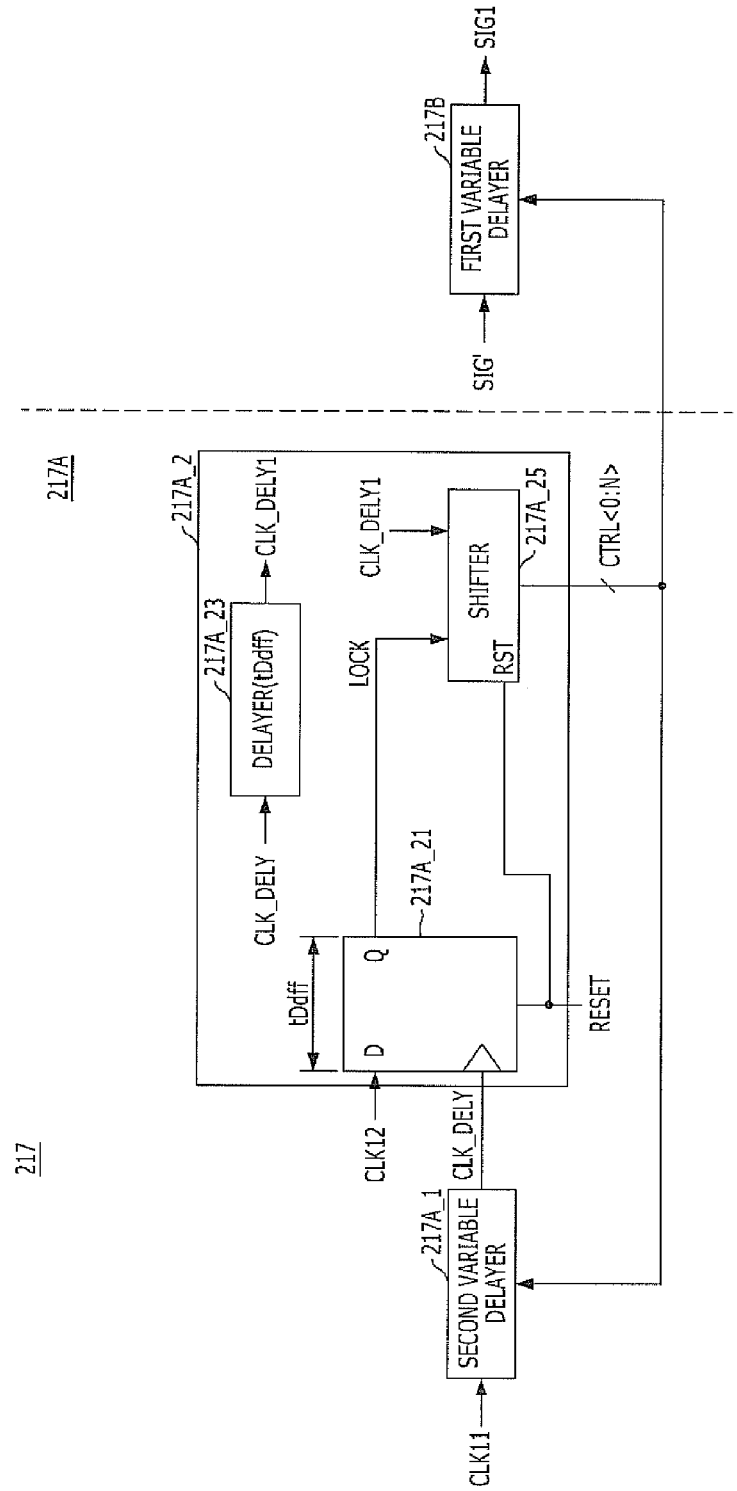
FIG. 5 is a block diagram of a correction circuit included in a first semiconductor chip illustrated in FIG. 4.

FIG. 5 is a block diagram of the correction circuit 217 included in the first semiconductor chip 210 illustrated in FIG. 4.

Although the correction circuit 217 is shown, the correction circuits 221, 231, and 241 all have the same configuration as correction circuit 217.

Referring to FIG. 5, the correction circuit 217 includes a delay time calculator 217A and a first variable delayer 217B. The delay time calculator 217A is configured to calculate a delay time corresponding to a phase difference between the first and second internal clock signals CLK11 and CLK12. The first variable delayer 217B sets a delay time in response to a control signal CTR<0:N> outputted from the delay time calculator 217A. The first variable delayer 217B is configured to delay the internal input signal SIG' by a delay amount that reflects the calculated delay time that was calculated by the delay time calculator 217B.

The delay time calculator 217A includes a second variable delayer 217A_1 and a control signal generator 217A_2. The second variable delayer 217A_1 has a delay time which is set in response to the control signal CTRL<0:N> and is configured to reflect the calculated delay time into the first internal clock signal CLK11. The control signal generator 217A_2 is configured to generate the control signal CTRL<0:N> in response to an output signal of the second variable delayer 217A_1 and the second internal clock signal CLK12.

Additionally, the control signal generator 217A_2 includes a D flip-flop 217A_21, a delayer 217A_23, and a shifter 217A_25. The D flip-flop 217A_21 is configured to output the second internal clock signal CLK12 in response to the output signal CLK_DELY of the second variable delayer 217A_1. The delayer 217A_23 is configured to delay the output signal CLK_DELY of the second variable delayer 217A_1 by a delay time tDdff based on the operation of the D flip-flop 217A_21. The shifter 217A_25 is configured to output the control signal CTRL<0:N> in response to an output signal LOCK of the D flip-flop 217A_21 and an output signal CLK_DELY1 of the delayer 217A_23. The D flip-flop 217A_21 and the shifter 217A_25 are reset in response to a reset signal RESET. For example, the reset signal RESET may be activated when the semiconductor integrated circuit 200 is initially driven or when an update operation is performed in a mode that does not transmit the external input signal SIG (for example, standby mode).

The first variable delayer 217B and the second variable delayer 217A_1 may include a variable coarse delay line (VCDL). In particular, the delay time of the first variable delayer 217B may be half of the delay time of the second variable delayer 217A_1. This process will be described below in detail.

Hereafter, a signal transmission method of the semiconductor integrated circuit 200 in accordance with the embodiment of the present invention will be described.

The signal transmission method of the semiconductor integrated circuit 200 in accordance with the embodiment of the present invention may be performed through two processes. More specifically, the processes include a first process of calculating delay times that reflect the delay times between the respective semiconductor chips 210, 220, 230, and 240 during a test mode, and a second process of reflecting the calculated delay times into the internal input signals SIG', SIG", SIG''', and SIG'''' transmitted to the respective semiconductor chips 210, 220, 230, and 240 during a normal mode.

First, the first process will be described.

When the semiconductor integrated circuit 200 enters the test mode, for example, only the switch 243 included in the uppermost second semiconductor chip 240 is activated in response to the top die signal TOP_DIE. Then, as a test enable signal TMEN is activated, the internal clock signal CLK generated by the clock signal generator 213 is applied to the second buffer 215.

The first internal clock signal CLK11 buffered through the second buffer 215 is applied to the correction circuit 217 and simultaneously transmitted to the first test TSV TSV21. Furthermore, the first internal clock signal CLK21 transmitted through the first test TSV TSV21 is applied to the correction circuit 221 and simultaneously transmitted to the first test TSV TSV22. Furthermore, the first internal clock signal CLK31 transmitted through the first test TSV TSV22 is applied to the correction circuit 231 and simultaneously transmitted to the first test TSV TSV23. Furthermore, the first internal clock signal CLK41 transmitted through the first test TSV TSV23 included in the fourth semiconductor chip 230 is applied to the correction circuit 241. The second internal clock signal CLK42 is obtained by passing the first internal clock signal CLK41 through the shorted switch 243. The second internal clock signal CLK42 is applied to the correction circuit 241 and simultaneously transmitted to the third semiconductor chip 230 through the second test TSV TSV33. Subsequently, the second internal clock signal CLK32 transmitted through the second test TSV TSV33 is applied to the correction circuit 231 and simultaneously transmitted to the second semiconductor chip 220 through the second test TSV TSV32. Furthermore, the second internal clock signal CLK22 transmitted through the second test TSV TSV32 is applied to the correction circuit 221 and simultaneously transmitted to the first semiconductor chip 210 through the second test TSV TSV31. Furthermore, the second internal clock signal CLK12 transmitted through the second test TSV TSV31 is applied to the correction circuit 217.

The phase differences between the first internal clock signals CLK11, CLK21, CLK31, and CLK41 and the second internal clock signals CLK12, CLK22, CLK32, and CLK42 applied to the respective correction circuits 217, 221, 231, and 241 will be described. The following descriptions do not include a delay time tDbuf2 by the second buffer 215. First, since the first internal clock signal CLK11 applied to the correction circuit 217 serves as the reference, the delay time of the first internal clock signal CLK11 is '0*tDtsv'. Since the first internal clock signal CLK21 applied to the correction circuit 221 passes through one TSV, TSV21, the delay time of the first internal clock signal CLK21 is '1*tDtsv'. Since the first internal clock signal CLK31 applied to the correction circuit 231 passes through two TSVs, TSV21 and TSV22, the delay time of the first internal clock signal CLK31 is '2*tDtsv'. Since the first internal clock signal CLK41 applied to the correction circuit 241 passes through three TSVs, TSV21, TSV22, and TSV23, the delay time of the first internal clock signal CLK41 is '3*tDtsv'. Furthermore, since the second internal clock signal CLK42 applied to the correction circuit 241 240 has the same delay time as the first internal clock signal CLK41, the delay time of the second internal clock signal CLK42 is '3*tDtsv'. Since the second internal clock signal CLK32 applied to the correction circuit 231 passes through four TSVs, TSV21, TSV22, TSV23, and TSV33, the delay time of the second internal clock signal CLK32 is '4*tDtsv'. Since the second internal clock signal CLK22 applied to the correction circuit 221 passes through five TSVs, TSV21, TSV22, TSV23, TSV33, and TSV32, the delay time of the second internal clock signal CLK22 is '5*tDtsv'. Since the second internal clock signal CLK12 applied to the correction circuit 217 passes through six TSVs, TSV21, TSV22, TSV23, TSV33, TSV32, and TSV31, the delay time of the second internal clock signal CLK12 is '6*tDtsv'. Accordingly, the phase difference between the first and second internal clock signals CLK11 and CLK12 applied to the correction circuit is '6*tDtsv (6*tDtsv−0*tDtsv)', the phase difference between the first and second internal clock signals CLK21 and CLK22 applied to the correction circuit 221 is '4*tDtsv (5*tDtsv−1*tDtsv)', the phase difference between the first and second internal clock signals CLK31 and CLK32 applied to the correction circuit 231 is '2*tDtsv (4*tDtsv−2*tDtsv)', and the phase difference between the first and second internal clock signals CLK41 and CLK42 applied to the correction circuit 241 is '0*tDtsv (3*tDtsv−3*tDtsv)'.

Therefore, the above-described phase differences are equal to the delay times calculated by the respective correction circuits 217, 221, 231, and 241, more specifically, the controlled delay times of the second variable delayers 217A_1 included in the respective correction circuits 217, 221, 231, and 241. Since the operations of the correction circuits 217, 221, 231, and 241 are performed in the same manner, the following descriptions will be focused on the correction circuit 217. When the semiconductor integrated circuit is initially driven, the second variable delayer 217A_1 has a delay time of '0' as a default value. Therefore, the second variable delayer 217A_1 outputs the first internal clock signal CLK12 without delay. Then, the D flip-flop 217A_21 activates the operation control signal LOCK according to a phase difference between the delayed first internal clock signal CLK_DELY and the second internal clock signal CLK12. The shifter 217A_25 generates the control signal CTRL<0:N> in response to the operation control signal LOCK of the D flip-flop 217A_21 and the output signal CLK_DELY1 of the delayer 217A_23. The second variable delayer 217A_1 controls the delay time in response to the control signal CTRL<0:N>. Accordingly, the second variable delayer 217A_1 delays the first internal clock signal CLK11 according to the control signal CTRL<0:N> and repeats the above-described series of operations. Then, when the phase difference between the delayed first internal clock signal CLK_DELY outputted from the second variable delayer 217A_1 and the second internal clock signal CLK12 becomes '0', the D flip-flop 217A_21 deactivates the operation control signal LOCK. The shifter 217A_25 locks the control signal CTRL<0:N> according to the deactivated operation control signal LOCK, and the second variable delayer 217A_1 controls the delay time according to the locked control signal CTRL<0:N>. After the above described operations, the controlled delay time becomes '6*tDtsv', which is equal to the phase difference between the first and second internal clock signals CLK11 and CLK12.

Next, the second process will be described.

First, the delay time of the second variable delayer 217_A and the first variable delayer 217B are controlled by the same control signal CTRL<0:N>. However, the delay time of the first variable delayer 217B is controlled by a time corresponding to the half of the delay time of the second variable delayer 217A_1. The delay time for the first variable delayer 217B is half the delay time of the second variable delayer 217_A because a delay time is two times larger than a delay time that is actually reflected through the signal transmission TSVs TSV11, TSV12, and TSV13. The delay time is two times larger because the signal used to calculate the delay time goes through twice as many test TSVs as signal transmission TSVs. In other words, in the normal mode, since the internal input signal SIG' applied to the first semiconductor chip 210 serves as the reference, the delay time of the internal input signal SIG' is '0*tDtsv'. Furthermore, since the internal input signal SIG" applied to the second semiconductor chip 220 passes through one signal transmission TSV TSV11, the delay time of the internal input signal SIG" is '1*tDtsv'. Furthermore, since the internal input signal SIG'" applied to the third semiconductor chip 230 passes through two signal transmission TSVs, TSV11 and TSV12, the delay time of the internal input signal SIG''' is '2*tDtsv'. Furthermore, since the internal input signal SIG'' applied to the fourth semiconductor chip 240 passes through three signal transmission TSVs, TSV11, TSV12, and TSV13, the delay time of the internal input signal SIG'''' is '3*tDtsv'. As shown, the delay time through the signal transmission TSVs corresponds to the half of the delay time calculated during the first process.

When the input signal SIG is applied during the normal mode, the input signal SIG is buffered into the internal input signal SIG' through the first buffer 211. The buffered internal input signal SIG' is applied to the correction circuit 217 and simultaneously transmitted to the signal transmission TSV TSV11. Then, the correction circuit 217 delays the internal input signal SIG' by '3*tDtsv' and outputs the first internal input signal SIG1. Furthermore, the internal input signal SIG'' transmitted through the signal transmission TSV TSV11 is applied to the correction circuit 221 and simultaneously transmitted to the signal transmission TSV TSV12. Then, the correction circuit 221 delays the internal input signal SIG'' by '2*tDtsv' and outputs the second internal input signal SIG2. Furthermore, the internal input signal SIG' transmitted through the signal transmission TSV TSV12 is applied to the correction circuit 231 and simultaneously transmitted to the signal transmission TSV TSV13. Then, the correction circuit 231 delays the internal input signal SIG''' by '1*tDtsv' and outputs the third internal input signal SIG3. Furthermore, the internal input signal SIG'''' transmitted through the signal transmission TSV TSV13 is applied to the correction circuit 241, and the correction circuit 241 delays the internal input signal SIG'''' by '0*tDtsv' and outputs the fourth internal input signal SIG4.

Figure 6:
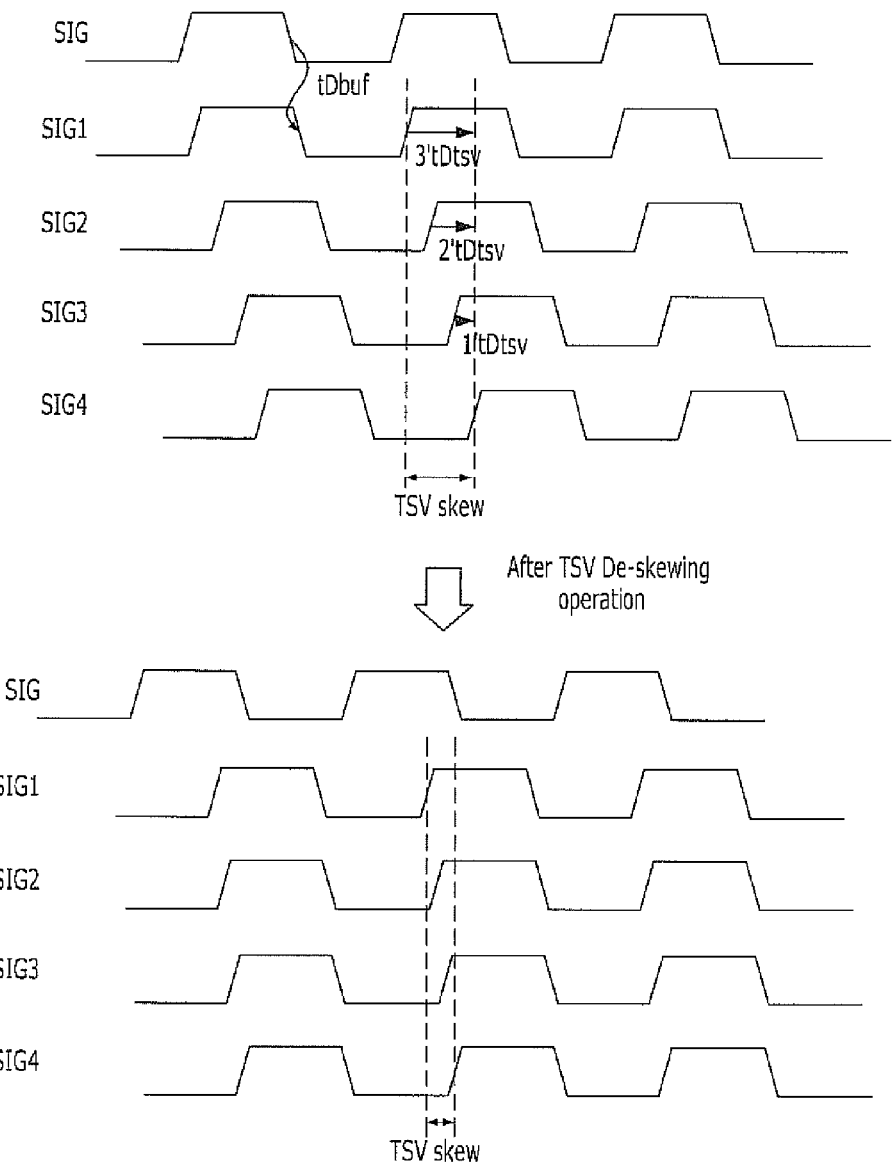
FIG. 6 is a timing diagram illustrating a signal transmission method of the semiconductor integrated circuit of FIG. 4.

Therefore, referring to FIG. 6, it can be seen that skews occurring between the respective semiconductor chips 210 to 240 are minimized in the first to fourth internal input signals SIG1, SIG2, SIG3, and SIG4 because of the delays reflected by the correction circuits.

In accordance with the embodiment of the present invention, the internal input signals SIG1, SIG2, and SIG3 of the semiconductor chips 210, 220, and 230 stacked in the lower portion are delayed by the corresponding delay times, based on the internal input signal SIG4 of the semiconductor chip 240 where the delay time is reflected most. Therefore, it is possible to minimize skews occurring between the stacked semiconductor chips. Accordingly, the embodiment of the present invention may be applied to a high-speed operation.

In accordance with the embodiments of the present invention, the delay times occurring between the stacked semiconductor chips are previously calculated and reflected into the signals applied to the semiconductor chips. Therefore, it is possible to minimize skews occurring between the stacked semiconductor chips.

While the present invention has been described with respect to the specific embodiments, it will be apparent to those skilled in the art that various changes and modifications may be made without departing from the spirit and scope of the invention as defined in the following claims.

For example, the control signal generator 217A_2 in accordance with the embodiment of the present invention may include a phase detector and a counter instead of the D flip-flop 217A_21 and the shifter 217A_25. In addition, any components may be applied as long as they can calculate a phase difference.

What is claimed is:

1. A signal transmission method of a semiconductor integrated circuit which transmits a signal applied from an external circuit to the plurality of stacked semiconductor chips, the signal transmission method comprising:
    calculating delay times that occur between the plurality of stacked semiconductor chips in a test mode; and
    reflecting the delay times into signals transmitted to the respective semiconductor chips and outputting the signals into the respective semiconductor chips, in a normal mode,
    wherein the delay time which is reflected in the normal mode is controlled to be the half of the delay time which is calculated in of the test mode.

2. The signal transmission method of claim 1, wherein calculating the delay time in the test mode further comprises:
    generating a control signal;
    sending the control signal to a plurality of delayers;
    delaying a first internal signal;
    repeating the test mode procedures until the first internal signal and a second internal signal have a zero phase difference.

3. The signal transmission method of claim 1, wherein the calculating delay times include calculating the delay times corresponding to a position of the plurality of semiconductor chips by using an internal signal transmitted through the plurality of semiconductor chips.

4. The signal transmission method of claim 3, wherein the internal signal comprises:
    a first internal signal transmitted in a first direction through the plurality of semiconductor chips; and
    a second internal signal obtained by returning the first internal signal in a second direction through the plurality of semiconductor chips, wherein the second direction is the opposite direction of the first direction.

5. The signal transmission method of claim 1, wherein the plurality of semiconductor chips comprise a master chip stacked at an uppermost position and at least one slave chip excluding the master chip.

6. The signal transmission method of claim 1, wherein the plurality of semiconductor chips comprise a master chip stacked at a lowermost position and at least one slave chip excluding the master chip.

* * * * *